(12) United States Patent
Yoshida et al.

(10) Patent No.: US 12,284,752 B2
(45) Date of Patent: Apr. 22, 2025

(54) TRANSIENT VOLTAGE PROTECTION DEVICE

(71) Applicant: TDK CORPORATION, Tokyo (JP)

(72) Inventors: Naoyoshi Yoshida, Tokyo (JP); Masato Hayatsu, Tokyo (JP); Shunsuke Takahashi, Tokyo (JP); Sota Hiraba, Tokyo (JP)

(73) Assignee: TDK CORPORATION, Tokyo (JP)

( * ) Notice: Subject to any disclaimer, the term of this patent is extended or adjusted under 35 U.S.C. 154(b) by 152 days.

(21) Appl. No.: 18/355,525

(22) Filed: Jul. 20, 2023

(65) Prior Publication Data

US 2024/0074039 A1 Feb. 29, 2024

(30) Foreign Application Priority Data

Aug. 31, 2022 (JP) .................. 2022-137737

(51) Int. Cl.
*H05K 1/02* (2006.01)

(52) U.S. Cl.
CPC ... *H05K 1/0257* (2013.01); *H05K 2201/0746* (2013.01)

(58) Field of Classification Search
CPC .............. H05K 1/0257; H05K 2201/0746
USPC .......................................... 361/56
See application file for complete search history.

(56) References Cited

U.S. PATENT DOCUMENTS

| | | | |
|---|---|---|---|
| 2012/0236450 A1* | 9/2012 | Adachi | H01T 4/12 29/592.1 |
| 2012/0293910 A1* | 11/2012 | Kauffman | H01G 4/35 361/302 |
| 2024/0071655 A1* | 2/2024 | Takahashi | H01C 7/12 |

FOREIGN PATENT DOCUMENTS

JP 5459295 B2 4/2014

* cited by examiner

*Primary Examiner* — Yemane Mehari
(74) *Attorney, Agent, or Firm* — Oliff PLC

(57) ABSTRACT

A transient voltage protection device includes an element body formed with a cavity inside, a pair of external electrodes on the element body, and a pair of internal electrodes in the element body. The pair of internal electrodes oppose each other. Each internal electrode is connected to a corresponding external electrode of the pair of external electrodes. The element body includes a first inner surface and a second inner surface. The first and second inner surfaces define the cavity and oppose each other. The pair of internal electrodes are exposed to the cavity and disposed on the first inner surface. In a cross section along a direction in which the first inner surface and the second inner surface oppose each other, the first inner surface includes a contour different from a contour included in the second inner surface.

11 Claims, 6 Drawing Sheets

TRANSIENT VOLTAGE PROTECTION DEVICE

CROSS-REFERENCE TO RELATED APPLICATIONS

This application is based upon and claims the benefit of priority from Japanese Patent Application No. 2022-137737, filed on Aug. 31, 2022. The entire contents of which are incorporated herein by reference.

BACKGROUND

Field

The present disclosure relates to a transient voltage protection device.

Description of the Related Art

Known transient voltage protection devices include an element body, a pair of external electrodes disposed on the element body, and a pair of internal electrodes disposed in the element body to oppose each other (see, for example, Japanese Patent No. 5459295). The element body is formed with a cavity inside. Each of the internal electrodes is connected to a corresponding external electrode of the pair of external electrodes and are exposed to the cavity.

SUMMARY

An object of one aspect of the present disclosure is to provide a transient voltage protection device that can improve mechanical strength.

The present inventors have conducted investigation and research a transient voltage protection device that can improve mechanical strength. As a result, the present inventors have obtained the following findings and have arrived at the present disclosure.

In a transient voltage protection device, a cavity formed inside an element body affects mechanical strength of the transient voltage protection device. The element body includes a first inner surface and a second inner surface that define the cavity. The first inner surface and the second inner surface oppose each other. The present inventors focused on the first inner surface and the second inner surface. As a result, the present inventors found that a transient voltage protection device capable of improving the mechanical strength includes a configuration in which the first inner surface includes a contour different from a contour included in the second inner surface in a cross section along a direction in which the first inner surface and the second inner surface oppose each other.

A transient voltage protection device according to one aspect of the present disclosure includes an element body, a pair of external electrodes disposed on the element body, and a pair of internal electrodes disposed in the element body to oppose each other. The element body is formed with a cavity inside. Each of the pair of internal electrodes is connected to a corresponding external electrode of the pair of external electrodes. The element body includes a first inner surface and a second inner surface that define the cavity and oppose each other. The pair of internal electrodes are exposed to the cavity and disposed on the first inner surface. In a cross section along a direction in which the first inner surface and the second inner surface oppose each other, the first inner surface includes a contour different from a contour included in the second inner surface.

In the one aspect described above, in the cross section along the direction in which the first inner surface and the second inner surface oppose each other, the first inner surface includes the contour different from the contour included in the second inner surface. Therefore, the one aspect described above can improve mechanical strength.

In the one aspect described above, at least one internal electrode of the pair of internal electrodes may include a first surface and a second surface oppose each other in the direction in which the first inner surface and the second inner surface oppose each other. The first surface may be in contact with the first inner surface. The second surface may be exposed to the cavity and may be inclined relative to the direction in which the first inner surface and the second inner surface oppose each other.

When a transient voltage is applied to the pair of external electrodes, a discharge is generated at portions of the pair of internal electrodes. The portions of the pair of internal electrodes oppose each other and are exposed to the cavity. In a configuration in which a facing area of the pair of internal electrodes is small, the discharge may be locally concentrated, which may deteriorate the transient voltage protection characteristics. In a configuration in which the second surface is inclined relative to the direction in which the first inner surface and the second inner surface oppose each other, the facing area of the pair of internal electrodes is increased compared with a configuration in which the second surface is orthogonal to the direction in which the first inner surface and the second inner surface oppose each other. Therefore, the present configuration in which the second surface is inclined relative to the direction in which the first inner surface and the second inner surface oppose each other reduces deterioration of the transient voltage protection characteristics.

In the one aspect described above, each of the pair of internal electrodes may include the first surface and the second surface. The second surfaces may oppose each other in a direction in which the pair of internal electrodes oppose each other.

In a configuration in which each of the pair of internal electrodes includes the second surface and the second surfaces oppose each other in the direction in which the pair of internal electrodes oppose each other, the facing area of the pair of internal electrodes is further increased. Therefore, the present configuration further reduces deterioration of the transient voltage protection characteristics.

In the one aspect described above, each of the pair of internal electrodes may include a side edge exposed to the cavity and coupling the first surface and the second surface. The side edges may oppose each other the direction in which the pair of internal electrodes oppose each other. A thickness of each of the pair of internal electrodes may decrease toward the side edge.

In a configuration in which the thickness of each of the pair of internal electrodes decreases toward the side edge, the facing area of the pair of internal electrodes tends to increase. Therefore, the present configuration can reduce deterioration of the transient voltage protection characteristics.

In the one aspect described above, the element body may include a discharge assistance portion in contact with the pair of internal electrodes. The discharge assistance portion may include the first inner surface.

In a configuration in which the discharge assistance portion includes the first inner surface that defines the cavity, a discharge reliably occurs between the pair of internal electrodes. Therefore, the present configuration reliably improves the transient voltage protection characteristics.

In the one aspect, the discharge assistance portion may be curved in the cross section.

In a configuration in which the discharge assistance portion is curved in the cross section, the facing area of the pair of internal electrodes tends to increase. Therefore, the present configuration can reduce deterioration of the transient voltage protection characteristics.

In the one aspect described above, the pair of internal electrodes may be curved along the discharge assistance portion in the cross section.

In a configuration in which the pair of internal electrodes is curved along the discharge assistance portion in the cross section, the facing area of the pair of internal electrodes tends to further increase. Therefore, the present configuration can further reduce deterioration of the transient voltage protection characteristics.

In the one aspect described above, each of the pair of internal electrodes may include a side edge exposed to the cavity and coupling the first surface and the second surface. The second surface may include a first portion and a second portion which are exposed to the cavity. The first portion may be located closer to the side edge than the second portion. A shortest distance between the first portion and the second inner surface may be greater than a shortest distance between the second portion and the second inner surface.

A configuration in which the shortest distance between the first portion and the second inner surface is greater than the shortest distance between the second portion and the second inner surface reliably realizes a configuration in which the second surface is inclined relative to the direction in which the first inner surface and the second inner surface oppose each other.

In the one aspect described above, the second surface may include a first region exposed to the cavity and a second region not exposed to the cavity. The first region and the second region may have different degrees of inclination relative to the direction in which the first inner surface and the second inner surface oppose each other.

In the one aspect described above, the second inner surface may include a contour in a substantially linear shape in the cross section.

A configuration in which the second inner surface includes the contour in the substantially linear shape in the cross section reliably realizes a transient voltage protection device capable of improving mechanical strength.

In the one aspect described above, the second inner surface may include a contour protruding toward the first inner surface in the cross section.

A configuration in which the second inner surface includes the contour protruding toward the first inner surface in the cross section reliably realizes a transient voltage protection device capable of improving mechanical strength.

The present disclosure will become more fully understood from the detailed description given hereinafter and the accompanying drawings which are given by way of illustration only, and thus are not to be considered as limiting the present disclosure.

Further scope of applicability of the present disclosure will become apparent from the detailed description given hereinafter. However, it should be understood that the detailed description and specific examples, while indicating embodiments of the present disclosure, are given by way of illustration only, since various changes and modifications within the spirit and scope of the present disclosure will become apparent to those skilled in the art from this detailed description.

DETAILED DESCRIPTION

Figure 1:
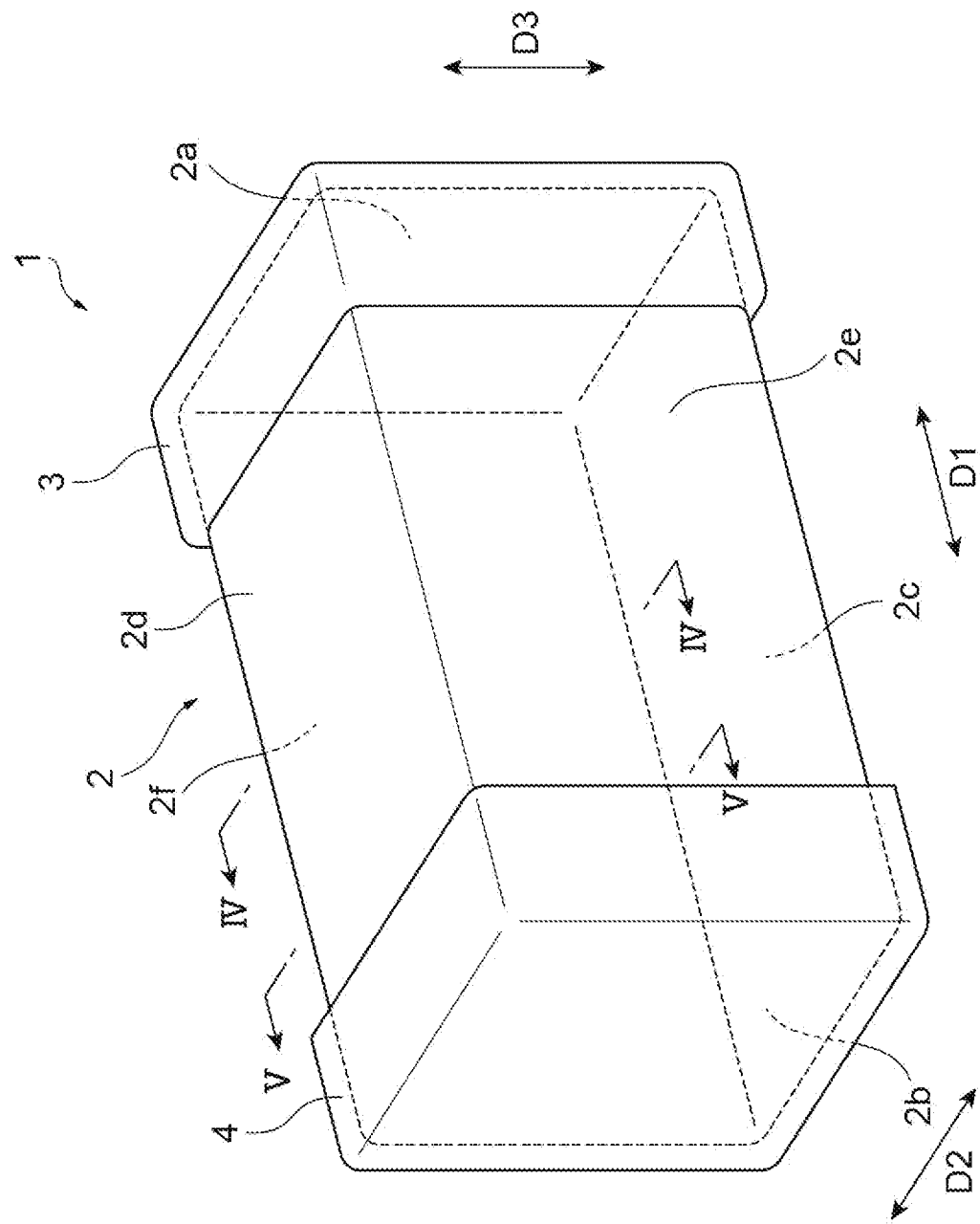
FIG. 1 is a perspective view illustrating a transient voltage protection device according to an embodiment.

Hereinafter, embodiments of the present disclosure will be described in detail with reference to the accompanying drawings. In the following description, the same elements or elements having the same functions are denoted with the same reference numerals and overlapped explanation is omitted.

Figure 2:
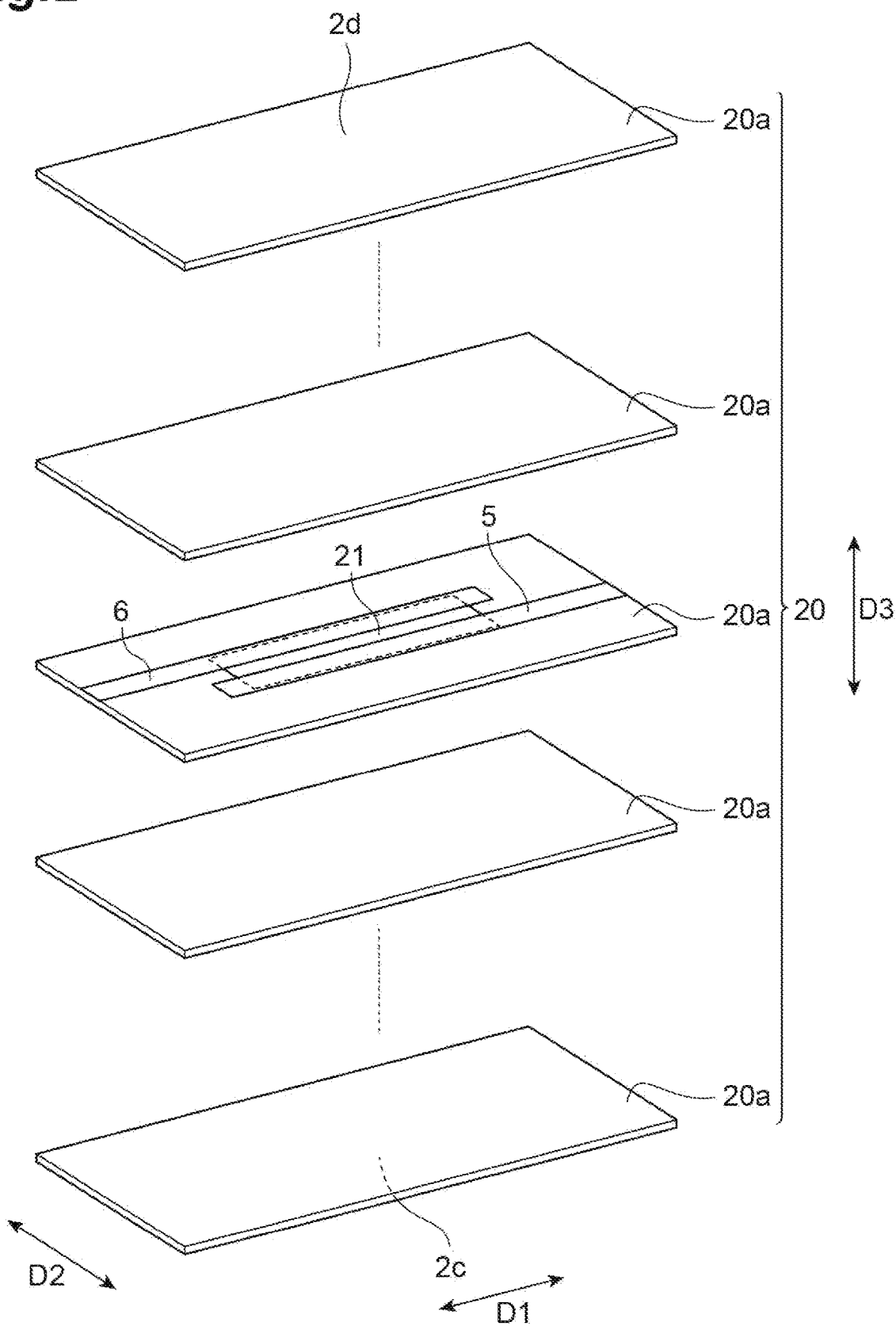
FIG. 2 is an exploded perspective view illustrating a configuration of an element body.
Figure 3:
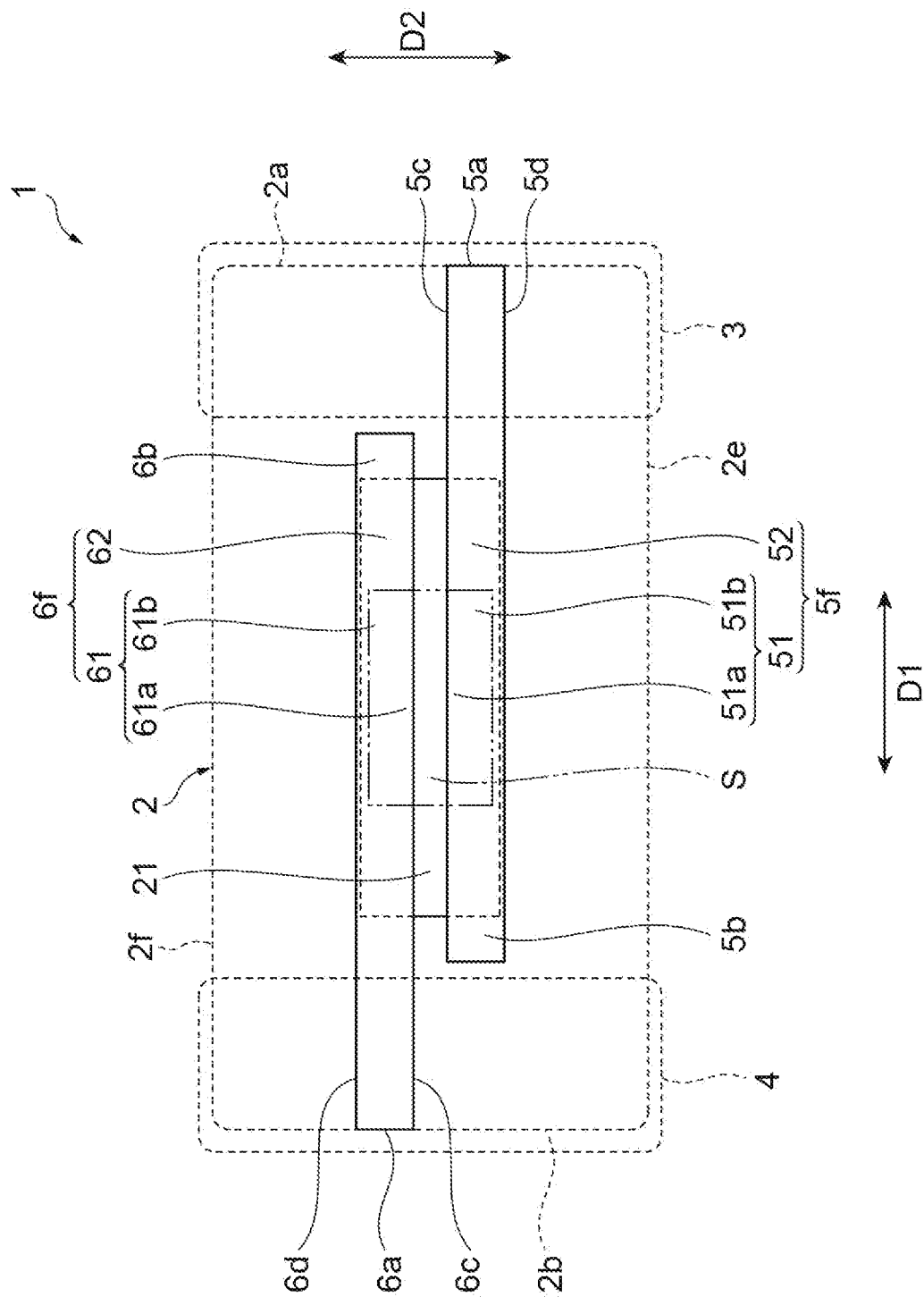
FIG. 3 is a view illustrating a pair of internal electrodes and a discharge assistance portion.
Figure 4:
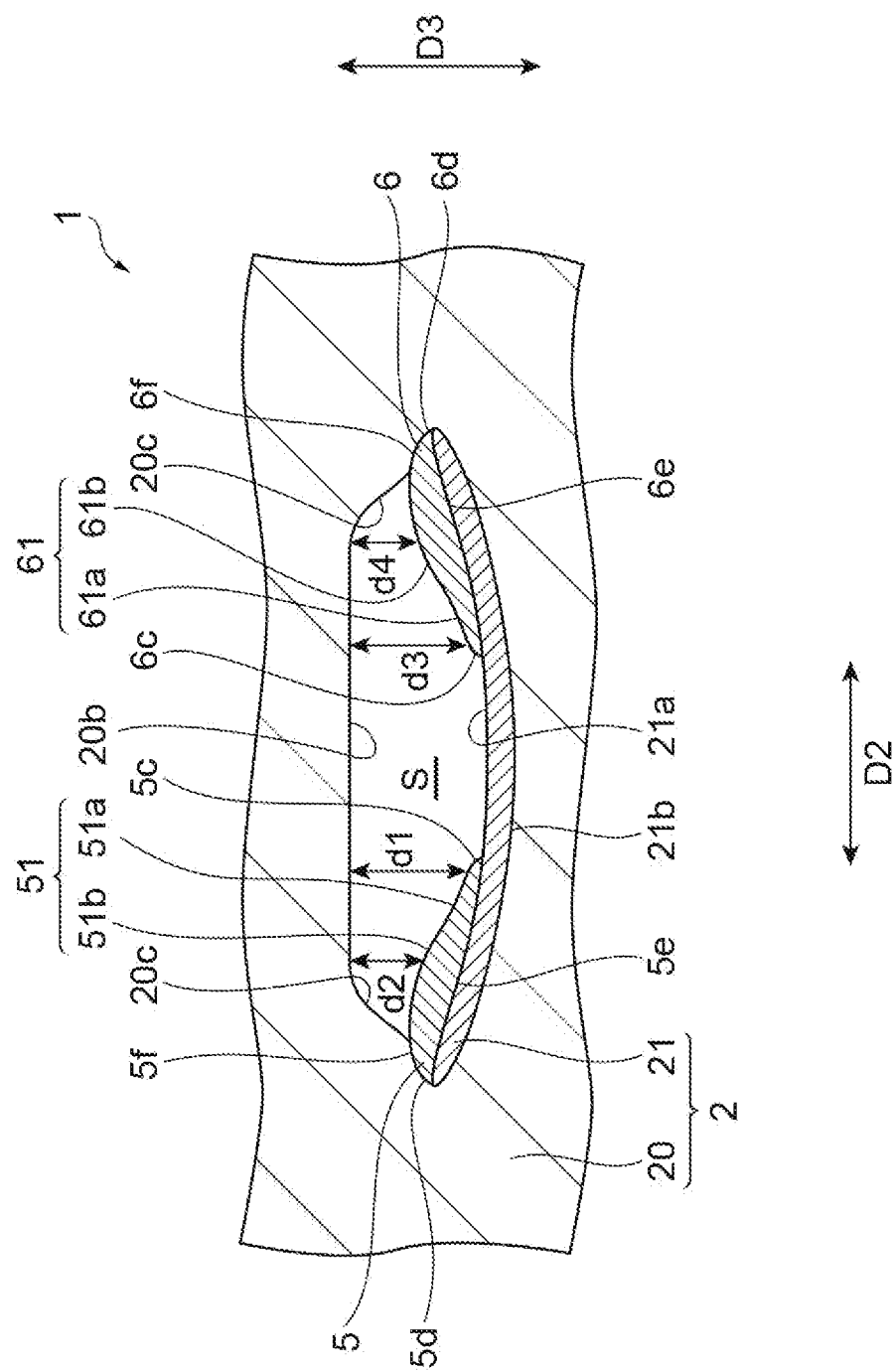
FIG. 4 is a view illustrating a cross-sectional configuration along line IV-IV of FIG. 1.
Figure 5:
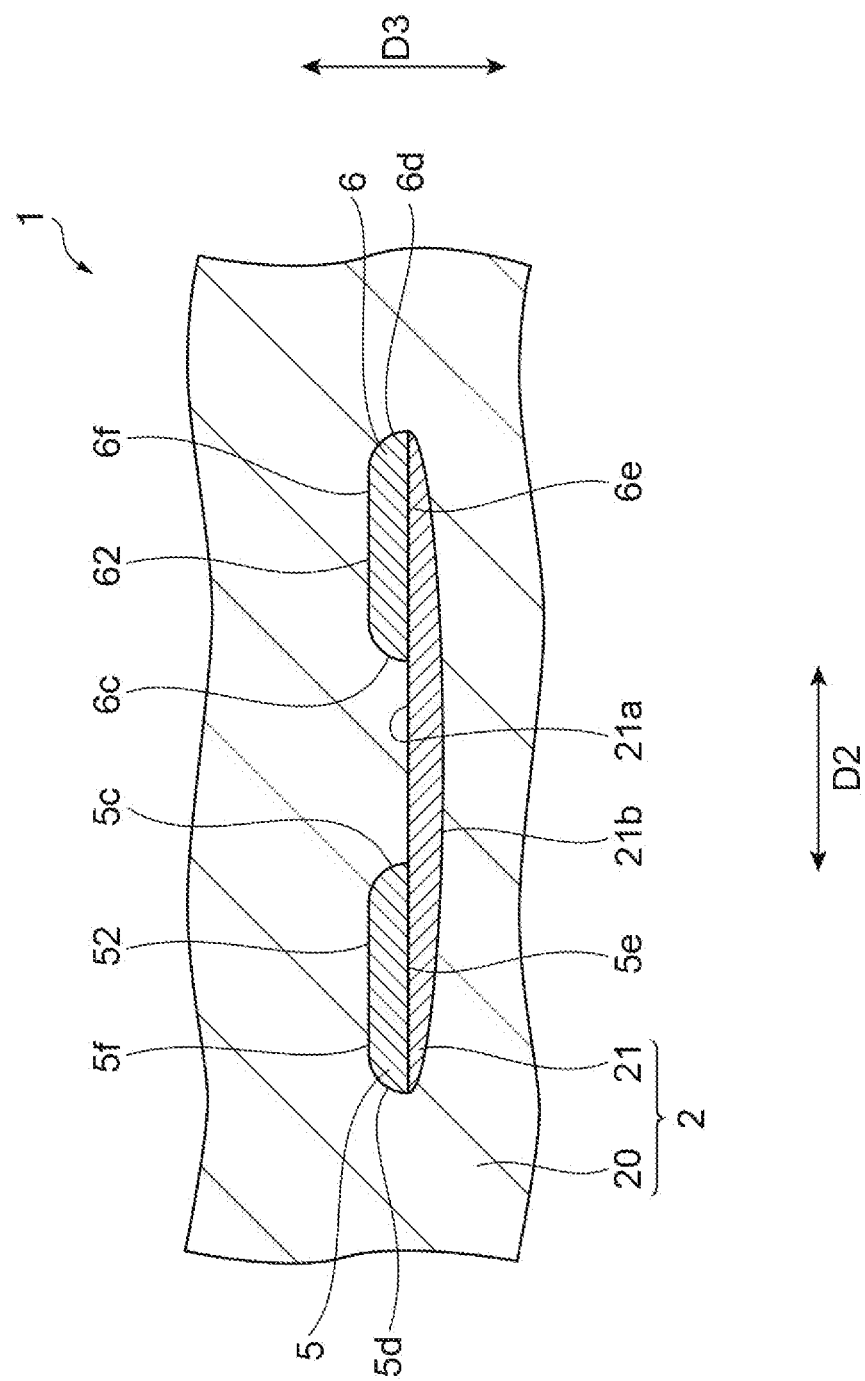
FIG. 5 is a view illustrating a cross-sectional configuration along line V-V in FIG. 1.

A configuration of a transient voltage protection device 1 according to the present embodiment will be described with reference to FIGS. 1 to 5. FIG. 1 is a perspective view illustrating the transient voltage protection device according to the present embodiment. FIG. 2 is an exploded perspective view illustrating a configuration of an element body. FIG. 3 is a view illustrating a pair of internal electrodes and a discharge assistance portion. FIG. 4 is a view illustrating a cross-sectional configuration along line IV-IV of FIG. 1. FIG. 5 is a view illustrating a cross-sectional configuration along line V-V in FIG. 1.

As illustrated in FIGS. 1 and 2, the transient voltage protection device 1 includes an element body 2, a pair of external electrodes 3 and 4, and a pair of internal electrodes 5 and 6. The transient voltage protection device 1 is mounted in an electronic device (not illustrated). The transient voltage protection device 1 protects an electronic device from a transient voltage. An electronic device protected by the transient voltage protection device 1 includes, for example, a circuit board or an electronic component. A transient voltage is caused by, for example, electro-static discharge (ESD).

The element body 2 has a rectangular parallelepiped shape. The rectangular parallelepiped shape includes, for example, a shape of a rectangular parallelepiped in which corner portions and ridgeline portions are chamfered or a shape of a rectangular parallelepiped in which corner portions and ridgeline portions are rounded. The element body 2 includes a pair of end surfaces 2a and 2b opposing each other, a pair of side surfaces 2c and 2d opposing each other, and a pair of side surfaces 2e and 2f opposing to each other. In the present embodiment, the pair of end surfaces 2a and 2b oppose each other in a first direction D1. The pair of side surfaces 2e and 2f oppose each other in a second direction D2. The pair of side surfaces 2c and 2d oppose each other in a third direction D3. An outer surface of the element body 2 includes the pair of end surfaces 2a and 2b and the four side surfaces 2c, 2d, 2e, and 2f. The four side surfaces 2c, 2d, 2e, and 2f are adjacent to the end surface 2a and the end surface 2b and extend in the first direction D1 to couple the end surface 2a and the end surface 2b to each other. One side surface of the four side surfaces 2c, 2d, 2e, and 2f is defined as a mounting surface opposing the electronic device on which the transient voltage protection device 1 is mounted.

As illustrated in FIG. 2, the element body 2 includes a main body portion 20. The main body portion 20 is formed through laminating a plurality of insulator layers 20a in the third direction D3. The main body portion 20 includes the plurality of laminated insulator layers 20a. In the main body portion 20, the insulator layers 20a are integrated with each other to such an extent that each boundary between the insulator layers 20a cannot be visually recognized. Each insulator layer 20a is formed as, for example, a sintered body of a ceramic green sheet. The ceramic green sheet includes an insulator material. The main body portion 20 includes the pair of end surfaces 2a and 2b and the four side surfaces 2c, 2d, 2e, and 2f.

The insulator material includes, for example, a ceramic material. The ceramic material is selected from the group consisting of $Fe_2O_3$, NiO, CuO, ZnO, MgO, $SiO_2$, $TiO_2$, $MnCO_3$, $SrCO_3$, $CaCO_3$, $BaCO_3$, $Al_2O_3$, $ZrO_2$, and $B_2O_3$, for example. The insulator layer 20a may include only a single ceramic material, or may include two or more kinds of ceramic materials. The insulator layer 20a may include glass. The insulator layer 20a may include copper oxide to enable low temperature sintering. The copper oxide includes CuO or $Cu_2O$.

The first direction D1 is a length direction of the element body 2. The second direction D2 is a width direction of the element body 2. The third direction D3 is a height direction of the element body 2. The length of the element body 2 is, for example, 0.6 mm or more and 2.0 mm or less. The width of the element body 2 is, for example, 0.3 mm or more and 1.2 mm or less. The height of the element body 2 is, for example, 0.2 mm or more and 1.2 mm or less. In the present embodiment, the length of the element body 2 is 1.0 mm. The width of the element body 2 is 0.5 mm. The height of the element body 2 is 0.5 mm.

The external electrodes 3 and 4 are disposed on the element body 2. The external electrodes 3 and 4 are disposed on the element body 2 to oppose each other in the first direction D1. The external electrodes 3 and 4 are disposed at both end portions of the element body 2 in the first direction D1. The external electrodes 3 and 4 are separated from each other in the first direction D1.

The external electrode 3 is disposed on the end surface 2a. The external electrode 3 is connected to the internal electrode 5. The external electrode 3 is physically and electrically connected to the internal electrode 5. The external electrode 3 covers the end surface 2a. The external electrode 3 also covers a part of each of the four side surfaces 2c, 2d, 2e, and 2f. A part of each of the four side surfaces 2c, 2d, 2e, and 2f covered with the external electrode 3 is located near the end surface 2a in the corresponding side surface of the four side surfaces 2c, 2d, 2e, and 2f. The external electrode 3 is disposed on the entire surface of the end surface 2a and the end portions of the side surfaces 2c, 2d, 2e, and 2f near the end surface 2a.

The external electrode 4 is disposed on the end surface 2b. The external electrode 4 is connected to the internal electrode 6. The external electrode 4 is physically and electrically coupled to the internal electrode 6. The external electrode 4 covers the end surface 2b. The external electrode 4 also covers a part of each of the four side surfaces 2c, 2d, 2e, and 2f. A part of each of the four side surfaces 2c, 2d, 2e, and 2f covered with the external electrode 4 is located near the end surface 2b in the corresponding side surface of the four side surfaces 2c, 2d, 2e, and 2f. The external electrode 4 is disposed on the entire surface of the end surface 2b and the end portions of the side surfaces 2c, 2d, 2e, and 2f near the end surface 2b.

The internal electrode 5 and 6 are disposed in the element body 2 to oppose each other in the second direction D2. Each of the internal electrodes 5 and 6 extends in the first direction D1. The internal electrode 5 is disposed near the side surface 2e. The internal electrode 6 is disposed near the side surface 2f. The internal electrodes 5 and 6 are disposed at the same height position, that is, at the same laminating position in the third direction D3. As illustrated in FIG. 2, the internal electrodes 5 and 6 are disposed on the same insulator layer 20a. The internal electrodes 5 and 6 are disposed substantially in the center in the third direction D3, that is, in the laminating direction of the insulator layers 20a.

As illustrated in FIG. 3, the internal electrode 5 has a pair of ends 5a and 5b, a pair of side edges 5c and 5d opposing each other, and a pair of surfaces 5e and 5f opposing each other. The side edge 5c opposes the internal electrode 6. Each of the side edge 5c and 5d may include a surface. Each of the side edges 5c and 5d is adjacent to the surface 5e and the surface 5f. The internal electrode 5 is separated from the end surface 2b and the side surfaces 2c, 2d, 2e, and 2f. For example, when the surface 5e includes a first surface, the surface 5f includes a second surface.

The end 5a is exposed on the end surface 2a. The end 5a is coupled to the external electrode 3. In the present embodiment, the end 5a is directly coupled to the external electrode 3. The end 5a includes a end coupled to the external electrode 3. The end 5a may include an end surface of the internal electrode 5. The end 5b is located on a side opposite to the end 5a in the first direction D1. The end 5b is located inside the element body 2 and is not exposed on the outer surface of the element body 2. The end 5b is separated from each of the end surfaces 2a and 2b. In the present embodiment, the end 5b includes not only an end of the internal electrode 5 but also a region extending from the end of the internal electrode 5 to a predetermined length. Therefore, the end 5b has the predetermined length in the first direction D1. The end 5b is buried in the element body 2 and is in contact with the element body 2 only. The end 5b is separated from the external electrode 4 and does not overlap the external electrode 4 when viewed in the third direction D3. The end 5b may include only the end of the internal electrode 5. In this case, the end 5b may include only the end surface of the internal electrode 5.

As illustrated in FIG. 3, the internal electrode 6 has a pair of ends 6a and 6b, a pair of side edges 6c and 6d opposing each other, and a pair of surfaces 6e and 6f opposing to each other. The side edge 6c opposes the internal electrode 5. Each of the side edge 6c and 6d may include a surface. Each of the side edges 6c and 6d is adjacent to the surface 6e and the surface 6f. The internal electrode 6 is separated from the end surface 2a and the side surfaces 2c, 2d, 2e, and 2f. For example, when the surface 6e includes a first surface, the surface 6f includes a second surface.

The end 6a is exposed on the end surface 2b. The end 6a is coupled to the external electrode 4. In the present embodiment, the end 6a is directly coupled to the external electrode 4. The end 6a includes a end coupled to the external electrode 4. The end 6a may include an end surface of the internal electrode 6. The end 6b is located on a side opposite to the end 6a in the first direction D1. The end 6b is located inside the element body 2 and is not exposed on the outer surface of the element body 2. The end 6b is separated from each of the end surfaces 2a and 2b. In the present embodiment, the end 6b includes not only an end of the internal electrode 6 but also a region extending from the end of the internal electrode 6 to a predetermined length. Therefore, the end 6b has the predetermined length in the first direction D1. The end 6b is buried in the element body 2 and is in contact with only the element body 2. The end 6b is separated from the external electrode 3 and does not overlap the external electrode 3 when viewed in the third direction D3. The end 6b may include only the end of the internal electrode 6. In this case, the end 6b may include only the end surface of the internal electrode 6.

The external electrodes 3 and 4 and internal electrodes 5 and 6 include electrically a conductive material. The conductive material includes, for example, Ag, Pd, Au, Pt, Cu, Ni, Al, Mo, or W. The conductive material may include, for example, a Ag/Pd alloy, a Ag/Cu alloy, a Ag/Au alloy, or a Ag/Pt alloy. The external electrodes 3 and 4 and internal electrodes 5 and 6 may include the same electrically conductive material. The external electrodes 3 and 4 and internal electrodes 5 and 6 may include electrically conductive materials different from each other.

The external electrodes 3 and 4 are formed, for example, through sintering an electrically conductive paste applied to the outer surface of the element body 2. The electrically conductive paste for forming the external electrodes 3 and 4 contains the above electrically conductive material. The internal electrodes 5 and 6 are formed, for example, through firing the electrically conductive paste applied on an insulator green sheet together with the insulator green sheet. The electrically conductive paste is applied on the insulator green sheet, for example, through printing. The electrically conductive paste for forming the internal electrodes 5 and 6 also contains the above electrically conductive material.

As illustrated in FIGS. 2 to 5, the element body 2 includes a discharge assistance portion 21. The discharge assistance portion 21 is disposed in the element body 2. The discharge assistance portion 21 is disposed inside the element body 2. The discharge assistance portion 21 is continuous with the main body portion 20. The discharge assistance portion 21 has a rectangular shape when viewed in the third direction D3. The discharge assistance portion 21 includes a pair of long sides extending in the first direction D1 and a pair of short sides extending in the second direction D2. The planar shape of the discharge assistance portion 21 indicates the shape obtained when the discharge assistance portion 21 is viewed in the third direction D3. The rectangular shape includes a shape with corners rounded or a shape with corners removed. The discharge assistance portion 21 is separated from the outer surface of the element body 2. The discharge assistance portion 21 is not exposed from the element body 2.

The length of the discharge assistance portion 21 is, for example, 0.03 mm or more and 1.6 mm or less. The width of the discharge assistance portion 21 is, for example, 0.03 mm or more and 0.9 mm or less. The thickness of discharge assistance portion 21 is, for example, 0.5 μm or more and 10 μm or less. In the present embodiment, the length of the discharge assistance portion 21 is 0.5 mm. In the present embodiment, the width of the discharge assistance portion 21 is 0.2 mm. In the present embodiment, the thickness of the discharge assistance portion 21 is 2 μm. The length of the discharge assistance portion 21 is defined by, for example, the length in the first direction D1. The width of the discharge assistance portion 21 is defined by, for example, the length in the second direction D2. The thickness of the discharge assistance portion 21 is defined by, for example, the length in the third direction D3.

The discharge assistance portion 21 includes a pair of surfaces 21a and 21b opposing each other in the third direction D3. The surface 21a is in contact with the internal electrodes 5 and 6. The internal electrodes 5 and 6 are disposed on the surface 21a. The surface 21a includes a portion covered with the internal electrodes 5 and 6 and a portion exposed from the internal electrodes 5 and 6. The surface 21b is continuous with the main body portion 20. The discharge assistance portion 21 is in contact with the internal electrodes 5 and 6 and couples the internal electrodes 5 and 6. The internal electrode 5 and the internal electrode 6 are coupled via the discharge assistance portion 21. A transient voltage suppressor includes the discharge assistance portion 21 and the internal electrodes 5 and 6. The transient voltage suppressor has transient voltage absorption capability.

In the present embodiment, one end of the discharge assistance portion 21 in the first direction D1 is located inside the end 5b of the internal electrode 5 in the first direction D1 in the element body 2. The other end of the discharge assistance portion 21 in the first direction D1 is located inside the end 6b of the internal electrode 6 in the first direction D1 in the element body 2. One end of the discharge assistance portion 21 in the second direction D2 coincides with the side edge 5d of the internal electrode 5 when viewed in the third direction D3. The other end of the discharge assistance portion 21 in the second direction D2 coincides with the side edge 6d of the internal electrode 6 when viewed in the third direction D3.

The discharge assistance portion 21 contains an insulator and a metal particle. The insulator includes, for example, a ceramic material. The ceramic material is selected from the group consisting of $Fe_2O_3$, NiO, CuO, ZnO, MgO, $SiO_2$, $TiO_2$, $MnCO_3$, $SrCO_3$, $CaCO_3$, $BaCO_3$, $Al_2O_3$, $ZrO_2$, and $B_2O_3$, for example. The discharge assistance portion 21 may include only one type of ceramic material selected from this group, or may include two or more types of ceramic materials selected from this group. The metal particle includes, for example, Ag, Pd, Au, Pt, a Ag/Pd alloy, a Ag/Cu alloy, a Ag/Au alloy, or a Ag/Pt alloy. The discharge assistance portion 21 may include a semiconductor particle. The semiconductor particle includes, for example, $RuO_2$. The discharge assistance portion 21 may include glass.

The discharge assistance portion 21 is formed, for example, through firing slurry applied on an insulator green sheet together with the insulator green sheet. The slurry includes the ceramic material and the metal particle. The slurry is applied on the insulator green sheet, for example, through printing.

As illustrated in FIGS. 3 and 4, The element body 2 is formed with a cavity S inside. The cavity S is separated from the outer surface of the element body 2. The surfaces defining the cavity S include the side edge 5c and the surface 5f of the internal electrode 5 and the side edge 6c and the surface 6f of the internal electrode 6. The main body portion 20 includes an inner surface 20b and a pair of inner surfaces 20c. The inner surface 20b defines the cavity S and opposes the surface 21a in the third direction D3. The pair of inner surfaces 20c define the cavity S and oppose each other in the second direction D2. The surfaces defining the cavity S include the inner surface 20b, the pair of inner surfaces 20c, and the surface 21a of the discharge assistance portion 21. For example, when the surface 21a includes a first inner surface defining the cavity S, the inner surface 20b includes a second inner surface defining the cavity S.

As illustrated in FIG. 4, in a cross section along the third direction D3, the surface 21a includes a contour different from a contour included in the inner surface 20b. The cross section along the third direction D3 is a cross section obtained, for example, through cutting the element body 2 along a plane orthogonal to the first direction D1 at a position where the cavity S is formed, as illustrated in FIG. 4. The surface 21a includes a contour in a curved shape. The inner surface 20b includes a contour in a substantially linear shape. The inner surface 20b includes a contour in a substantially linear shape along the second direction D2. In the present embodiment, each of the pair of inner surfaces 20c includes a contour in a shape inclined relative to the third direction D3. Each of the pair of inner surfaces 20c may include a contour in a substantially linear shape along the third direction D3. The cross section along the third direction D3 may be a cross section obtained through cutting the element body 2 along a plane orthogonal to the second direction D2 at a position where the cavity S is formed.

When viewed in the third direction D3, the cavity S is located inside the outer edge of the discharge assistance portion 21. The cavity S is shorter than the discharge assistance portion 21 in each of the first direction D1 and the second direction D2. One end of the cavity S in the second direction D2 is located inside the side edge 5d of the internal electrode 5 when viewed in the third direction D3. The other end of the cavity S in the second direction D2 is located inside the side edge 6d of the internal electrode 6 when viewed in the third direction D3.

The cavity S is formed, for example, through firing an organic lacquer applied on an insulator green sheet together with the insulator green sheet. The cavity S is formed through burning out the organic lacquer. The organic lacquer includes an organic solvent and an organic binder. The organic lacquer is applied on the insulator green sheet, for example, through printing.

As illustrated in FIG. 4, the discharge assistance portion 21 is curved in the cross section along the third direction D3. The discharge assistance portion 21 is curved in an arc shape in the cross section along the third direction D3. The surface 21a and the surface 21b are curved in an arc shape. In the present embodiment, the surface 21a and the surface 21b are curved such that both ends of the discharge assistance portion 21 in the second direction D2 are tapered. The internal electrodes 5 and 6 are also curved in the cross section along the third direction D3. The internal electrodes 5 and 6 are curved along the discharge assistance portion 21. Similarly to the discharge assistance portion 21, the internal electrodes 5 and 6 are also curved in an arc shape in the cross section along the third direction D3. In the present embodiment, the surface 5e of the internal electrode 5 and the surface 6e of the internal electrode 6 are curved in an arc shape along the surface 21a of the discharge assistance portion 21.

As illustrated in FIG. 4, the surface 5f of the internal electrode 5 and the surface 6f of the internal electrode 6 are inclined relative to the third direction D3. The surface 5f and the surface 6f are inclined in a direction from the inner surface 20b toward the surface 21a in the third direction D3. As described above, since the surface 5f and the surface 6f are inclined relative to the third direction D3, the surface 5f and the surface 6f oppose each other in the second direction D2. In the cavity S, the side edge 5c and the side edge 6c oppose each other in the second direction D2. In the cavity S, the surface 5f and the surface 6f oppose each other in the second direction D2.

The thickness of the internal electrode 5 decreases toward the side edge 5c. The thickness of the internal electrode 5 is defined by the length of the internal electrode 5 in the third direction D3. In the present embodiment, the thickness of the internal electrode 5 decreases from substantially the center of the internal electrode 5 in the second direction D2 to the side edge 5c. The thickness of the internal electrode 5 is the smallest at the side edge 5c. The thickness of the internal electrode 5 may decrease continuously or stepwise toward the side edge 5c.

The thickness of the internal electrode 6 decreases toward the side edge 6c. The thickness of the internal electrode 6 is defined by the length of the internal electrode 6 in the third direction D3. In the present embodiment, the thickness of the internal electrode 6 decreases from substantially the center of the internal electrode 6 in the second direction D2 to the side edge 6c. The thickness of the internal electrode 6 is the smallest at the side edge 6c. The thickness of the internal electrode 6 may decrease continuously or stepwise toward the side edge 6c.

Each thickness of the internal electrodes 5 and 6 may be measured, for example, on the basis of a cross section obtained through cutting the element body 2 along a plane orthogonal to the first direction D1 at a position where the internal electrodes 5 and 6 are included.

As illustrated in FIG. 4, the surface 5f includes a region 51 exposed to the cavity S. The surface 5f further includes portions 51a and 51b exposed to the cavity S. The region 51 includes the portions 51a and 51b. In the present embodiment, the region 51 includes only the portion 51a and the portion 51b. The portion 51a is located closer to the side edge 5c than the portion 51b in the second direction D2. For example, when the portion 51a includes a first portion, the portion 51b includes a second portion.

As described above, the inner surface 20b includes the contour in a substantially linear shape in the second direction D2. The surface 5f is inclined relative to the third direction D3. A shortest distance d1 between the portion 51a and the inner surface 20b and A shortest distance d2 between the portion 51b and the inner surface 20b are different from each other. In the present embodiment, the shortest distance d1 is greater than the shortest distance d2. The shortest distance d1 is defined by a distance between the portion 51a and the inner surface 20b in the third direction D3. The shortest distance d2 is defined by a distance between the portion 51b and the inner surface 20b in the third direction D3.

The surface 6f includes a region 61 exposed to the cavity S. The surface 6f further includes portions 61a and 61b exposed to the cavity S. The region 61 includes the portions 61a and 61b. In the present embodiment, the region 61 includes only the portion 61a and the portion 61b. The portion 61a is located closer to the side edge 6c than the portion 61b in the second direction D2. For example, when the portion 61a includes a first portion, the portion 61b includes a second portion.

As described above, the inner surface 20b includes the contour in a substantially linear shape in the second direction D2. The surface 6f is inclined relative to the third direction D3. The shortest distance d3 between the portion 61a and the inner surface 20b and the shortest distance d4 between the portion 61b and the inner surface 20b are different from each other. In the present embodiment, the shortest distance d3 is greater than the shortest distance d4. The shortest distance d3 is defined by a distance between the portion 61a and the inner surface 20b in the third direction D3. The shortest distance d4 is defined by a distance between the portion 61b and the inner surface 20b in the third direction D3.

The shortest distance d1 is, for example, 3 μm or more and 40 μm or less. The shortest distance d2 is, for example, 1 μm or more and 30 μm or less. In the present embodiment, the shortest distance d1 is 15 μm and the shortest distance d2 is 10 μm.

The shortest distance d3 is, for example, 3 μm or more and 40 μm or less. The shortest distance d4 is, for example, 1 μm or more and 30 μm or less. In the present embodiment, the shortest distance d3 is 15 μm and the shortest distance d4 is 10 μm.

As illustrated in FIG. 5, the surface 5f includes a region 52 not exposed to the cavity S. In the present embodiment, the surface 5f includes the region 51 exposed to the cavity S and the region 52 not exposed to the cavity S. The region 52 is in contact with only element body 2. The entire region 52 is covered with the element body 2. As illustrated in FIGS. 4 and 5, the region 51 and the region 52 have different degrees of inclination relative to the third direction D3. The degree of inclination relative to the third direction D3 in the region 52 is smaller than the degree of inclination relative to the third direction D3 in the region 51. In the present embodiment, the degree of inclination relative to the third direction D3 is defined by the angle of inclination relative to the third direction D3. The region 51 and the region 52 have different angles of inclination relative to the third direction D3. The angle of inclination relative to the third direction D3 in the region 52 is smaller than the angle of inclination relative to the third direction D3 in the region 51. In the present embodiment, the angle of inclination relative to the third direction D3 in the region 52 is a substantially right angle. The angles of inclination relative to the third direction D3 in the regions 51 and 52 may be measured, for example, on the basis of a cross section obtained through cutting the element body 2 along a plane orthogonal to the first direction D1 at a position where the regions 51 and 52 are included. For example, when the region 51 includes a first region, the region 52 includes a second region.

The surface 6f includes a region 62 not exposed to the cavity S. In the present embodiment, the surface 6f includes the region 61 exposed to the cavity S and the region 62 not exposed to the cavity S. The region 62 is in contact with only element body 2. The entire region 62 is covered with the element body 2. The region 61 and the region 62 have different degrees of inclination relative to the third direction D3. The degree of inclination relative to the third direction D3 in the region 62 is smaller than the degree of inclination relative to the third direction D3 in the region 61. The region 61 and the region 62 have different angles of inclination relative to the third direction D3. The angle of inclination relative to the third direction D3 in the region 62 is smaller than the angle of inclination relative to the third direction D3 in the region 61. In the present embodiment, the angle of inclination relative to the third direction D3 in the region 62 is a substantially right angle. The angles of inclination relative to the third direction D3 in the regions 61 and 62 may be measured, for example, on the basis of a cross section obtained through cutting the element body 2 along a plane orthogonal to the first direction D1 at a position where the regions 61 and 62 are included. For example, when the region 61 includes a first region, the region 62 includes a second region.

As described above, in the transient voltage protection device 1, the surface 21a includes the contour different from the contour included in the inner surface 20b in the cross section along the third direction D3. In the transient voltage protection device 1, the volume of the cavity S tends to be small compared with a configuration in which the surface 21a includes the same contour as the contour included in the inner surface 20b. The volume of the cavity S and mechanical strength of the transient voltage protection device 1 are related with each other. In a case where the volume of the cavity S is small, mechanical strength of the transient voltage protection device tends to be improved. Therefore, the transient voltage protection device 1 can improve mechanical strength.

In the transient voltage protection device 1, at least one of the surface 5f and the surface 6f is exposed to the cavity S and is inclined relative to the third direction D3.

In a case where a transient voltage is applied to the pair of external electrodes 3 and 4, a discharge is generated at the portions of the pair of internal electrodes 5 and 6 which oppose each other and are exposed to the cavity S. In a case where a facing area of the pair of internal electrodes 5 and 6 is small, the discharge may be locally concentrated, which may deteriorate the transient voltage protection characteristics. In the transient voltage protection device 1 in which at least one of the surface 5f and the surface 6f is exposed to the cavity S and is inclined relative to the third direction D3, the facing area of the pair of internal electrodes 5 and 6 is increased compared with a configuration in which the surface 5f or the surface 6f is orthogonal to the third direction D3. Therefore, the transient voltage protection device 1 reduces deterioration of the transient voltage protection characteristics.

In the transient voltage protection device 1, each of the surface 5f and the surface 6f is exposed to the cavity S and is inclined relative to the third direction D3.

In the transient voltage protection device 1, the facing area of the pair of internal electrodes 5 and 6 is further increased. Therefore, the transient voltage protection device 1 further reduces deterioration of the transient voltage protection characteristics.

In the transient voltage protection device 1, the internal electrode 5 has the side edge 5c exposed to the cavity S and coupling the surface 5e and the surface 5f. The internal electrode 6 has the side edge 6c exposed to the cavity S and coupling the surface 6e and the surface 6f. The side edges 5c and 6c oppose each other in the second direction D2. The thickness of the internal electrode 5 decreases toward the side edge 5c. The thickness of the internal electrode 6 decreases toward the side edge 6c.

In the transient voltage protection device 1, the facing area of the pair of internal electrodes 5 and 6 tends to increase. Therefore, the transient voltage protection device 1 can reduce deterioration of the transient voltage protection characteristics.

In the transient voltage protection device 1, the element body 2 includes the discharge assistance portion 21 in contact with the pair of internal electrodes 5 and 6. The discharge assistance portion 21 includes the surface 21a.

In the transient voltage protection device 1, a discharge reliably occurs between the pair of internal electrodes 5 and 6. Therefore, the transient voltage protection device 1 reliably improves the transient voltage protection characteristics.

In the transient voltage protection device 1, the discharge assistance portion 21 is curved in the cross section along the third direction D3.

In the transient voltage protection device 1, the facing area of the pair of internal electrodes 5 and 6 tends to increase. Therefore, the transient voltage protection device 1 can reduce deterioration of the transient voltage protection characteristics.

In the transient voltage protection device 1, the pair of internal electrodes 5 and 6 are curved along the discharge assistance portion 21 in the cross section along the third direction D3.

In the transient voltage protection device 1, the facing area of the pair of internal electrodes 5 and 6 tends to increase. Therefore, the transient voltage protection device 1 can further reduce deterioration of the transient voltage protection characteristics.

In the transient voltage protection device 1, the shortest distance d1 between the portion 51a and the inner surface 20b is greater than the shortest distance d2 between the portion 51b and the inner surface 20b. The shortest distance d3 between the portion 61a and the inner surface 20b is greater than the shortest distance d4 between the portion 61b and the inner surface 20b.

The transient voltage protection device 1 reliably realizes a configuration in which the surfaces 5f and 6f are inclined relative to the third direction D3.

In the transient voltage protection device 1, the region 51 and the region 52 have different degrees of inclination relative to the third direction D3. The region 61 and the region 62 have different degrees of inclination relative to the third direction D3.

In the transient voltage protection device 1, the degrees of inclination of the regions 51 and 61 relative to the third direction D3 can increase. In this case, the facing area of the pair of internal electrodes 5 and 6 tends to increase. Therefore, the transient voltage protection device 1 can reduce deterioration of the transient voltage protection characteristics.

In the transient voltage protection device 1, the inner surface 20b includes the contour in a substantially linear shape in the cross section along the third direction D3.

The transient voltage protection device 1 reliably realizes a transient voltage protection device that can improve mechanical strength.

In the transient voltage protection device 1, the degree of inclination relative to the third direction D3 in the region 52 is smaller than the degree of inclination relative to the third direction D3 in the region 51. The degree of inclination relative to the third direction D3 in the region 62 is smaller than the degree of inclination relative to the third direction D3 in the region 61.

In the transient voltage protection device 1, the regions 52 and 62 and the element body 2 are reliably brought into contact with each other, and the strength of the element body 2 is improved. Therefore, the transient voltage protection device 1 can improve mechanical strength.

Figure 6:
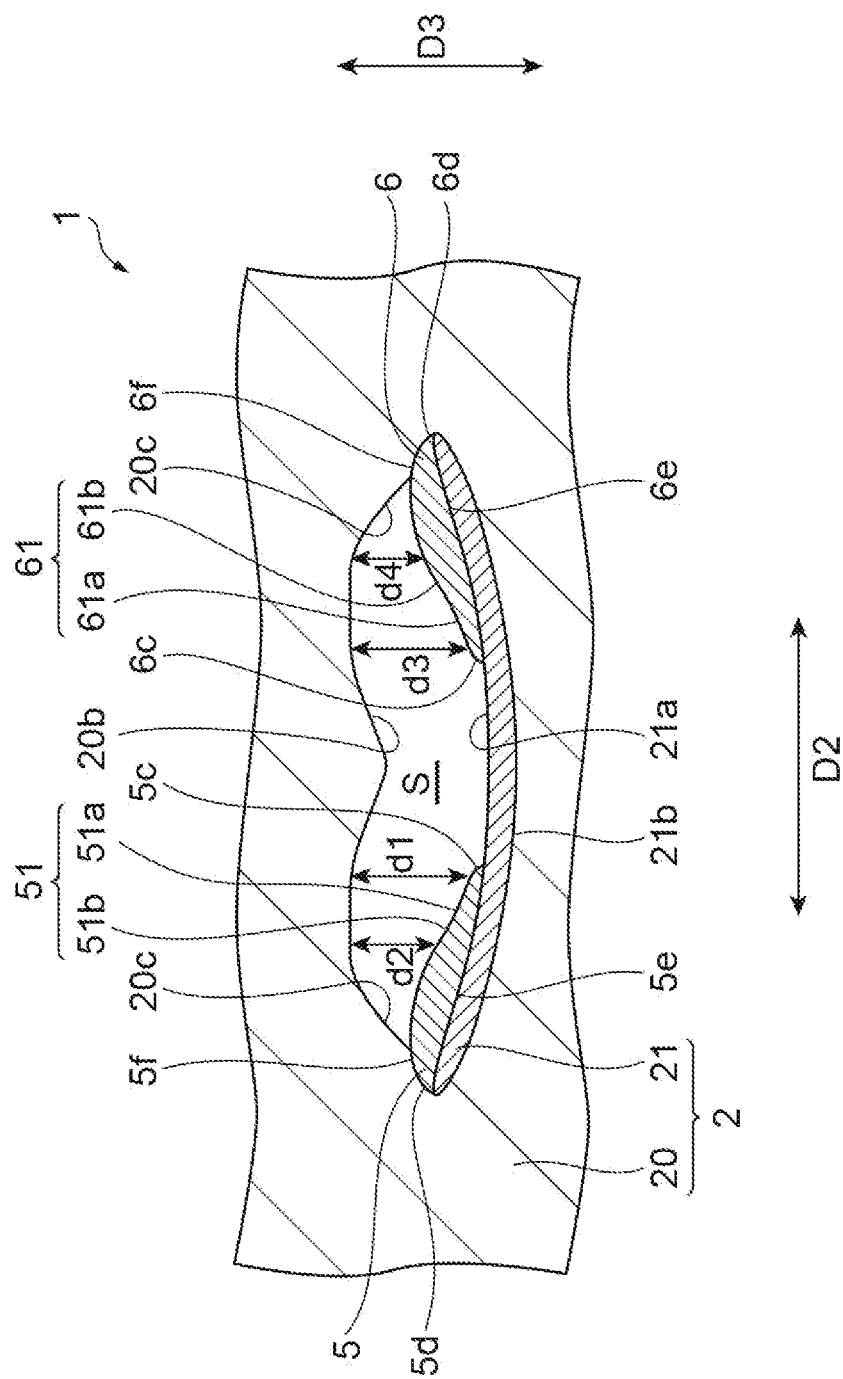
FIG. 6 is a view illustrating a cross-sectional configuration of a transient voltage protection device according to a modification of the present embodiment.

Next, a configuration of a modification of the transient voltage protection device 1 will be described with reference to FIG. 6. FIG. 6 is a view illustrating a cross-sectional configuration of a transient voltage protection device according to the modification of the present embodiment. The present modification differs from the present embodiment described above in the configuration of the inner surface 20b. Differences between the present embodiment described above and the present modification will be mainly described below. FIG. 6 illustrates a cross-sectional configuration of the transient voltage protection device 1 (the element body 2) according to the present modification when cut at a position corresponding to the cutting position in FIG. 4.

In the cross section along the third direction D3, the inner surface 20b includes a contour protruding toward the surface 21a. In the present modification, a central portion of the contour of the inner surface 20b in the second direction D2 protrudes toward the surface 21a. In the contour of the inner surface 20b, a position at which a portion protrudes toward the surface 21a is not limited to the position described above. In the contour of the inner surface 20b, a portion located near the internal electrode 5 may protrude toward the surface 21a, and a portion located near the internal electrode 6 may protrude toward the surface 21a. In the present modification, the cross section along the third direction D3 is a cross section obtained, for example, through cutting the element body 2 along a plane orthogonal to the first direction D1 at a position where the cavity S is formed, as illustrated in FIG. 6.

Although the embodiment of the present disclosure has been described above, the present disclosure is not necessarily limited to the embodiment, and the embodiment can be variously changed without departing from the scope of the disclosure.

Each of the surface 5f and the surface 6f may not be inclined relative to the third direction D3. In this case, at least one of the surface 5f and the surface 6f may be inclined relative to the third direction D3. Alternatively, each of the surface 5f and the surface 6f may be orthogonal to the third direction D3. The transient voltage protection device 1 in which each of the surface 5f and the surface 6f is inclined relative to the third direction D3 further reduces the deterioration of the transient voltage protection characteristics as described above.

In the transient voltage protection device 1, the thickness of the internal electrode 5 may not decrease toward the side edge 5c. The thickness of the internal electrode 6 may not decrease toward the side edge 6c. The transient voltage protection device 1 in which the thickness of the internal electrode 5 decreases toward the side edge 5c and the thickness of the internal electrode 6 decreases toward the side edge 6c can reduce the deterioration of the transient voltage protection characteristics as described above.

In the transient voltage protection device 1, the element body 2 may not include the discharge assistance portion 21. The transient voltage protection device 1 in which the element body 2 includes the discharge assistance portion 21 reliably improves the transient voltage protection characteristics as described above. In a configuration in which the element body 2 does not include the discharge assistance portion 21, the main body portion 20 includes another inner surface oppose the inner surface 20b in the third direction D3. In this case, another inner surface defines the cavity S together with the inner surface 20b and the pair of inner surfaces 20c.

In the transient voltage protection device 1, the discharge assistance portion 21 may not be curved in the cross section along the third direction D3. The transient voltage protection device 1 in which the discharge assistance portion 21 is curved in the cross section along the third direction D3 can reduce the deterioration of the transient voltage protection characteristics as described above.

In the transient voltage protection device 1, the pair of internal electrodes 5 and 6 may not be curved along the discharge assistance portion 21 in the cross section along the third direction D3. The transient voltage protection device 1 in which the pair of the internal electrodes 5 and 6 are curved along the discharge assistance portion 21 in the cross section along the third direction D3 can further reduce the deterioration of the transient voltage protection characteristics as described above.

In the transient voltage protection device 1, the shortest distance d1 between the portion 51a and the inner surface 20b may not be greater than the shortest distance d2 between the portion 51b and the inner surface 20b. The shortest distance d3 between the portion 61a and the inner surface 20b may not be greater than the shortest distance d4 between the portion 61b and the inner surface 20b. The transient voltage protection device 1 in which the shortest distance d1 is greater than the shortest distance d2 and the shortest distance d3 is greater than the shortest distance d4 reliably realizes a configuration in which the surfaces 5f and 6f are inclined relative to the third direction D3.

In the transient voltage protection device 1, the region 51 and the region 52 may not have different degrees of inclination relative to the third direction D3. The region 61 and the region 62 may not have different degrees of inclination relative to the third direction D3. The transient voltage protection device 1 in which the region 51 and the region 52 have different degrees of inclination relative to the third direction D3 and the region 61 and the region 62 have different degrees of inclination relative to the third direction D3 can reduce the deterioration of the transient voltage protection characteristic as described above.

In the transient voltage protection device 1, the inner surface 20b may not include the contour in a substantially linear shape in the cross section along the third direction D3. The transient voltage protection device 1 in which the inner surface 20b includes the contour in a substantially linear shape in the cross section along the third direction D3 reliably realizes a transient voltage protection device capable of improving mechanical strength as described above.

What is claimed is:

1. A transient voltage protection device comprising:
    an element body formed with a cavity inside;
    a pair of external electrodes disposed on the element body; and
    a pair of internal electrodes disposed in the element body to oppose each other and each connected to a corresponding external electrode of the pair of external electrodes,
    wherein the element body includes a first inner surface and a second inner surface that define the cavity and oppose each other,
    the pair of internal electrodes are exposed to the cavity and disposed on the first inner surface, and
    in a cross section along a direction in which the first inner surface and the second inner surface oppose each other, the first inner surface includes a contour different from a contour included in the second inner surface.

2. The transient voltage protection device according to claim 1,
    wherein at least one internal electrode of the pair of internal electrodes includes a first surface and a second surface oppose each other in the direction in which the first inner surface and the second inner surface oppose each other,
    the first surface is in contact with the first inner surface, and
    the second surface is exposed to the cavity and is inclined relative to the direction in which the first inner surface and the second inner surface oppose each other.

3. The transient voltage protection device according to claim 2,
    wherein each of the pair of internal electrodes includes the first surface and the second surface, and
    the second surfaces oppose each other in a direction in which the pair of internal electrodes oppose each other.

4. The transient voltage protection device according to claim 2,
    wherein each of the pair of internal electrodes includes a side edge exposed to the cavity and coupling the first surface and the second surface,
    the side edges oppose each other in a direction in which the pair of internal electrodes oppose each other, and
    a thickness of each of the pair of internal electrodes decreases toward the side edge.

5. The transient voltage protection device according to claim 1,
    wherein the element body includes a discharge assistance portion in contact with the pair of internal electrodes, and
    the discharge assistance portion includes the first inner surface.

6. The transient voltage protection device according to claim 5,
    wherein the discharge assistance portion is curved in the cross section.

7. The transient voltage protection device according to claim 6,
    wherein the pair of internal electrodes are curved along the discharge assistance portion in the cross section.

8. The transient voltage protection device according to claim 2,
    wherein each of the pair of internal electrodes includes a side edge exposed to the cavity and coupling the first surface and the second surface,
    the second surface includes a first portion and a second portion which are exposed to the cavity,
    the first portion is located closer to the side edge than the second portion, and
    a shortest distance between the first portion and the second inner surface is greater than a shortest distance between the second portion and the second inner surface.

9. The transient voltage protection device according to claim 2,
    wherein the second surface includes a first region exposed to the cavity, and a second region not exposed to the cavity, and
    the first region and the second region have different degrees of inclination relative to the direction in which the first inner surface and the second inner surface oppose each other.

10. The transient voltage protection device according to claim 1,
    wherein the second inner surface includes a contour in a substantially linear shape in the cross section.

11. The transient voltage protection device according to claim 1,
    wherein the second inner surface includes a contour protruding toward the first inner surface in the cross section.

* * * * *